United States Patent [19]
Tsujimoto et al.

[11] 4,131,753
[45] Dec. 26, 1978

[54] MULTIPLE ELECTRON-BEAM VAPOR SOURCE ASSEMBLY

[75] Inventors: Kazumi N. Tsujimoto, Moraga; Paul S. McLeod, Berkeley, both of Calif.

[73] Assignee: Airco, Inc., Montvale, N.J.

[21] Appl. No.: 797,965

[22] Filed: May 18, 1977

[51] Int. Cl.² .............................................. H01J 37/305
[52] U.S. Cl. ........................................................ 13/31 EB
[58] Field of Search .............................. 13/31, 31 EB; 219/121 EB

[56] References Cited

U.S. PATENT DOCUMENTS

| | | | |
|---|---|---|---|
| 3,270,233 | 8/1966 | Dietrich | 13/31 X |
| 3,655,902 | 4/1972 | Firestone et al. | 13/31 |
| 3,710,072 | 1/1973 | Shrader et al. | 219/121 EB |

*Primary Examiner*—R. N. Envall, Jr.
*Attorney, Agent, or Firm*—David A. Draegert; Edmund W. Bopp; Larry R. Cassett

[57] ABSTRACT

Disclosed is a vapor source assembly comprising a means for supporting at least one material to be vaporized, a plurality of electron-beam guns for producing electron beams, and a deflecting means for producing a magnetic field to deflect each electron beam through an arcuate path from its electron-beam gun to the material to be vaporized. The deflecting means includes a plurality of pairs of pole pieces positioned such that a north pole piece and a south pole piece, are on opposite sides of each electron-beam gun, and a plurality of magnetic means including magnets for interconnecting the south pole piece of each successive electron-beam gun with the north pole piece of the next successive electron-beam gun so as to form a single magnetic circuit. In preferred embodiments, the electron-beam guns are positioned below the maximum level of material in a cluster of crucibles, and two long pole pieces extend on opposite sides of the crucibles, but no pole piece extends between adjacent crucibles. A magnetic means for sweeping the electron beams may also be included.

10 Claims, 5 Drawing Figures

//  4,131,753

MULTIPLE ELECTRON-BEAM VAPOR SOURCE ASSEMBLY

BACKGROUND OF THE INVENTION

The invention is in the field of apparatus for heating material by electron beam bombardment, such as a vapor source for depositing coating material on a substrate.

Electron-beam heated vapor sources are frequently used in vacuum coating systems. One such vapor source is described in U.S. Pat. No. 3,710,072, issued to Robert L. Shrader and Kazumi N. Tsujimoto and assigned to the assignee of the present invention. This vapor source comprised a single crucible, a single electron-beam gun, and a magnetic means for deflecting the electron beam through an arcuate path from the electron-beam gun to the crucible. The magnetic deflecting means included two parallel plates of magnetic material which were positioned on opposite sides of the electron-beam gun and extended on opposite sides of the crucible. The plates were polarized by interconnecting them with a single magnet near their ends which were further from the electron-beam gun. The magnet and the two pole pieces were part of a single magnetic circuit. The electron beam was deflected by the magnetic field produced between the pole pieces. This prior vapor source also included a means for sweeping the electron beam across the crucible.

In some applications it is desirable to install two or more vapor sources near each other in order to allow simultaneous evaporation of a plurality of materials from separate crucibles bombarded by separate electron beams. It is sometimes imperative that such crucibles be clustered whereby the vapors appear to come from a single direction. With many prior vapor source assemblies the close approach of side-by-side vapor sources was prevented by the pole pieces which extended on opposite sides of each crucible. Further, in order to prevent undesirable interactions between the magnetic fields of the separate vapor sources, it was sometimes necessary to place a magnetic shield to isolate the separate magnetic circuits of the separate vapor sources.

SUMMARY OF THE INVENTION

Very generally, the vapor source assembly of the present invention comprises a means for supporting at least one material to be vaporized, a plurality of electron-beam guns for producing electron beams, and a deflecting means for producing a magnetic field to deflect each electron beam through an arcuate path from its electron-beam gun to the material to be vaporized. The deflecting means includes a plurality of pairs of pole pieces positioned such that a north pole piece and a south pole piece are on opposite sides of each electron-beam gun, and a plurality of magnetic means including magnets for interconnecting the south pole piece of each successive electron-beam gun with the north pole piece of the next successive electron beam so as to form a single magnetic circuit.

In preferred embodiments of the invention, the electron-beam guns are protected from the upward-streaming vapor by positioning each gun below the maximum level of material in a cluster of crucibles and initially directing the beam horizontally away from the cluster. Further, all parts of the vapor assembly are preferably placed below the top of the crucibles.

The vapor source assembly provides a plurality of well-formed electron beams each of which can be focused on a small impact region which may be located in the center of a corresponding crucible. Further, the magnetic field in the vicinity of the crucible is reduced so that the curvature of the electron beam inside the crucible is reduced. Thus, when the beam is normally incident on the crucible the beam impact location is less sensitive to the level of material in the crucible, and a higher fraction of the material can be vaporized without adjustment of the beam deflection parameters. The vapor source assembly may also include magnetic means for sweeping each electron beam across a crucible with a minium of interaction between one electron beam and the sweeping means of an adjacent electron beam.

The present vapor source assembly is advantageous because it allows simultaneous or sequential evaporation or sublimation of material from several crucibles which are heated by bombardment of separately controllable electron beams. The crucibles can be placed close together because it is not necessary for pole pieces or magnetic shields to extend between adjacent crucibles. Alternatively a plurality of electron-beam guns can be placed near each other to heat material contained in a single crucible.

DESCRIPTION OF THE PREFERRED EMBODIMENTS

Figure 1:
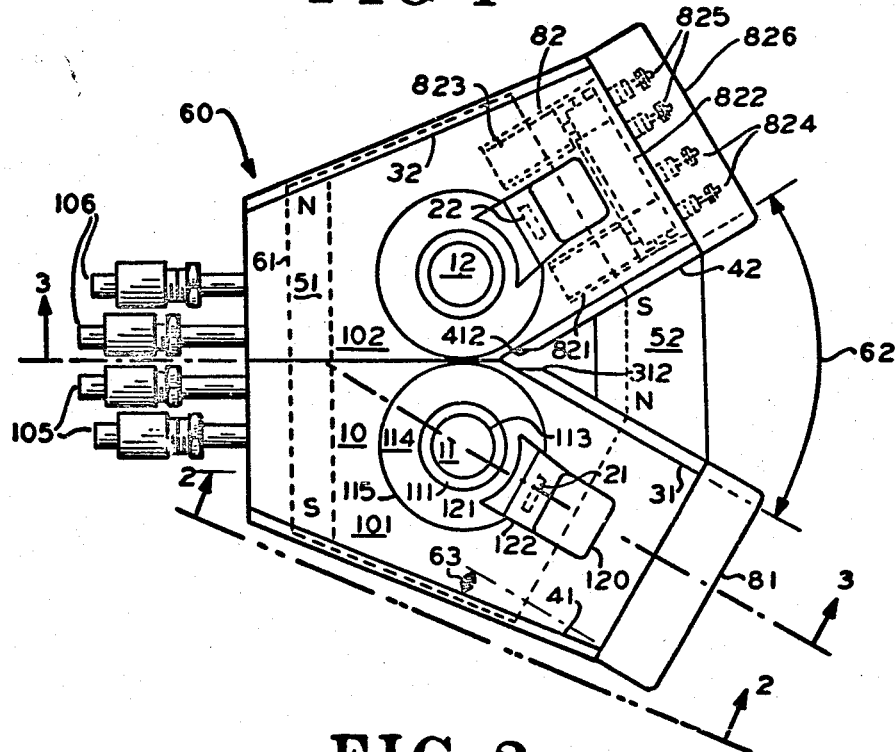
FIG. 1 is a plan view of a vapor source assembly having two electron-beam guns and two crucibles.
Figure 2:
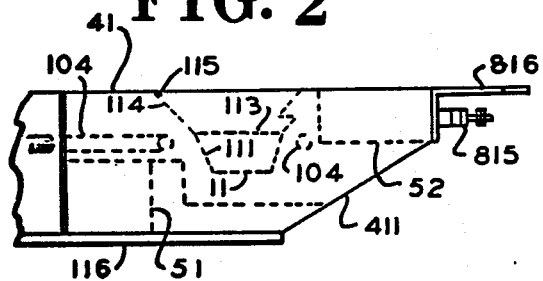
FIG. 2 is an elevational view along line 2—2 of FIG. 1.
Figure 3:
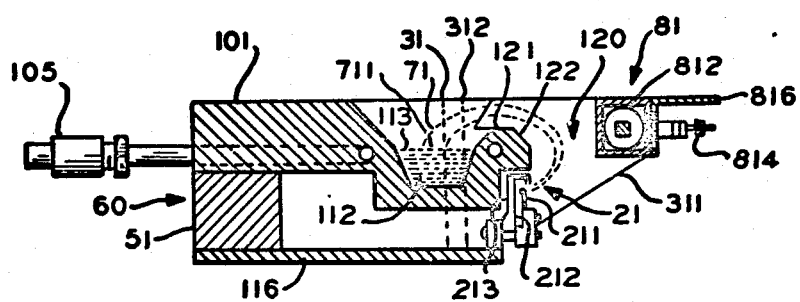
FIG. 3 is an elevational view partially in cross-section along the line 3—3 of FIG. 1.

FIG. 1-3 illustrate one preferred embodiment of the vapor source assembly of the present invention. This embodiment comprises a first crucible 11 and a similar second crucible 12. First crucible 11 has a circular pocket having a frustoconical wall 111 for containing material 112 to be vaporized. Normally, the level of material 11 in the crucible does not extend above a rim 113 at the top of wall 111. A second frustoconical wall 114 extends above rim 113. Wall 114 forms a hopper for receiving material to be vaporized, aids in confining the upward vapor flow, and protects other parts of the vapor source assembly from the deposition of vaporized material. All parts of the vapor source assembly are below the top of crucible 11 which is rim 115 at the top of wall 114.

Crucibles 11 and 12 are formed by removing material from a solid block 10 of a non-magnetic material, such as copper. If desired block 10 can be divided into separate similar blocks 101 and 102. Block 101 is cooled by circulating water or other fluid through channel 104 which is connected to a pair of entrance and exit connectors 103. Block 102 is cooled by circulating fluid in a channel connected to a second pair of connectors 106. Blocks 101, 102 and the other parts of the vapor source assembly are fixed by any suitable means to a support plate 116 which is formed from a suitable non-magnetic material, such as non-magnetic stainless steel.

Block 101 is also provided with an opening 120 which has three vertical walls and a fourth wall which intersects upper wall 114 of crucible 11. Opening 120 and crucible 11 are separated by a horizontal shelf 121 which has one tapered edge 122. In order to prevent spillage, the level of molten material in crucible 11 should not exceed the highest portion of shelf 121.

A first electron-beam gun 21 is positioned below shelf 121 where it is protected from the vapor streaming upward from crucible 11. The electron-beam gun comprises a generally U-shaped filament 211 which is heated by an electric current and is maintained at a high negative potential. Filament 211 is partially enclosed by a beam former 212 which is also maintained at a high negative potential. The emitted electrons are accelerated by an anode 213 which is normally maintained at ground potential.

As it emerges from gun 21, the first electron beam 71 is directed horizontally away from crucible 11. Under the influence of a magnetic deflecting means 60, which will be described, the electron beam is deflected along an arcuate path, shown in FIG. 3, which extends upward through opening 120, across above shelf 121, and then downward to a beam impact region 711 on the material in crucible 11. In a similar manner, a second electron beam emerges from a second electron-beam gun 22, and is deflected along an arcuate path to second crucible 12.

The deflecting means 60 comprises a plurality of plates which are polarized by a plurality of magnets having their north and south poles in a particular orientation. All of the pole pieces are formed from a magnetic material, such as a magnetic stainless steel. All of the pole pieces are plates which are generally rectangular except for chambers, such as 311 and 411, at the ends further from magnet 51. A first north pole piece 31 and a first south pole piece 41 are positioned on opposite sides of first gun 21. In a similar manner, a second north pole piece 32 and a second south pole piece 42 are positioned on opposite sides of second gun 22. The ends of north pole piece 31 and south pole piece 42 nearer the crucibles have tapers 312 and 412, respectively in order to obtain a wider air gap between the two pole pieces.

In the embodiment shown in FIGS. 1-3, the first south pole piece 41 and the second north pole piece 32 are interconnected and polarized by a first magnetic means comprising first magnet 51. The second south pole piece 42 and the first north pole piece 31 are interconnected and polarized by a second magnetic means comprising second magnet 52. The north and south poles of the magnets are indicated by the letters N and S, respectively. The arrangement of pole pieces and magnets is such that deflecting means 60 has a single magnetic circuit as indicated by the closed figure 61 which represents a line of magnetic flux. The resulting magnetic field extends into the regions between each electron-beam gun and the corresponding crucible and deflects the beams along separate arcuate paths.

In the preferred embodiment of FIG. 1, first south pole piece 41 and second north pole piece 32 are formed from 6.75 × 2.5 × 0.25 in plates. Second south pole piece 42 and first north pole piece 31 are formed from 3.75 × 2.5 × 0.25 in plates. Long pole pieces 41 and 32 are on opposite sides of guns 21 and 22, and short pole piece 42 and 31 are between guns 21 and 22. Long pole pieces 41 and 32 extend along opposite sides of crucibles 11 and 12, but short pole pieces 42 and 31 do not extend between crucibles 11 and 12. The angle 62 between the short pole pieces 31 and 42 is approximately 60°. The angle 63 between short pole piece 31 and long pole piece 41 is approximately 8°. The distance of closest approach of pole pieces 31 and 41 is 3.5 in. The distance between the centers of circular crucibles 11 and 12 is 3.0 in. The horizontal distance from filament 211 to the center of crucible 11 is 1.62 in. Magnets 51 and 52 are magnetized to about 440 gauss and 370 gauss, respectively. With this arrangement of pole pieces, magnets, guns and crucibles the electron beams from guns 21 and 22 are deflected to impact in small regions near the centers of the corresponding crucibles. The size, shape, and location of an impact region vary with changes in the arrangement of the deflecting means.

A beam-sweeping means 80 is provided for sweeping the electron beams over the surface of the material to be vaporized. The first electron beam, from gun 21, is swept across crucible 11 by a first beam-sweeping means 81. Similarly, the second electron beam, from gun 22, is swept across crucible 12 by a similar second beam-sweeping means 82. As shown in FIG. 1, beam-sweeping means 82 comprises three coils 821, 822 and 823. Coils 821 and 823 have parallel axes and are positioned above and on opposite sides of gun 22. Coils 821 and 823 are connected in series with a pair of electrical terminals 824. Coil 822 extends transversely between coils 823 and 821 to form a generally U-shaped structure which opens toward the crucible. Coil 822 is connected to a pair of electrical terminals 825. When an appropriate electrical signal is applied to coils 821 and 823 the second beam is deflected laterally in a direction parallel to the axis of coil 822. When an appropriate electrical signal is applied to coil 822 the second beam is deflected in a longitudinal direction parallel to the axes of coils 821 and 823. Beam-sweeping means 81 operate 82 operated in a manner described in the previously mentioned U.S. Pat. No. 3,710,072, which is incorporated herein by reference.

The particular arrangement of magnetic means 60 and beam-sweeping means 80 provides a minimum of interference between the sweeping means of one beam and the deflection of the other beam. In one experiment with the embodiment of FIG. 1, the deflection of the impact region of the second beam in crucible 12 was observed as the first beam was swept approximately 1.4 in. from one side of crucible 11 to the other. The impact area of the second beam shifted approximately 0.1 in. longitudinally when the first beam was swept in the longitudinal direction. The second beam was not noticeably deflected when the first beam was swept in the lateral direction. Further tests showed that the beams were nearly normally incident on the impact regions and that the horizontal location of an impact region was relatively independent of the level of the molten material in the crucible.

Figure 4:
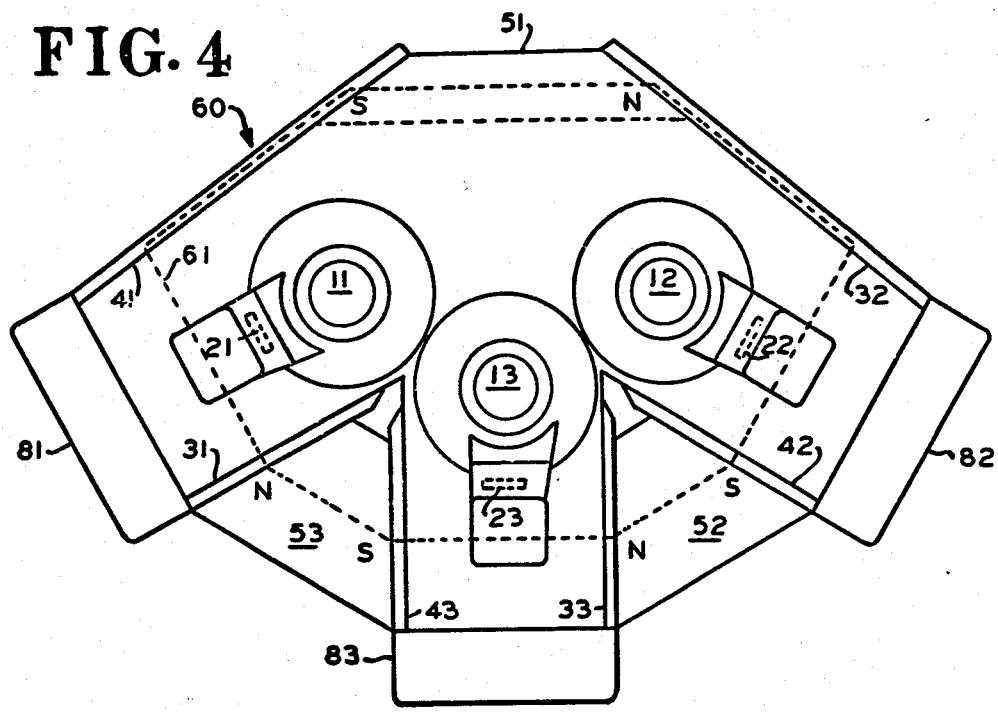
FIG. 4 is a plan view of a vapor source assembly having three electron-beam guns and three crucibles.

FIG. 4 illustrates a second preferred embodiment. This vapor source assembly comprises first and second crucibles 11, 12; electron-beam guns 21, 22; north pole pieces 31, 32; and south pole pieces 41, 42. In addition there is a third crucible 13, interposed between crucibles 11 and 12, a third electron beam gun 23, and a third north 33 and a third south 43 pole piece placed on opposite sides of gun 23. Pole pieces 41 and 32 extend on opposite sides of the cluster of three crucibles. Pole pieces 31, 43, 33, 42 do not extend between crucibles 11 and 13 or between crucibles 12 and 13, and crucible 13 is adjacent both crucibles 11 and 12.

In this embodiment, deflecting means 60 comprises first south pole piece 41 and second north pole piece 32 which are interconnected by a first magnetic means comprising a first magnet 51. Second south pole piece 42 and first north pole piece 31 are interconnected by a second magnetic means comprising second magnet 52 and also pole pieces 33, 43 and a third magnet 53. Deflecting means 60 forms a single magnetic circuit represented by a line of flux 61. The resulting magnetic field deflects the three electron beams from the three guns 21–23 along separate paths to the corresponding crucibles 11–13. The vapor source assembly also includes beam sweeping means 81–83, which are similar to those of the embodiment of FIG. 1. The linear and angular dimensions, and the pole strengths of the magnets of the particular embodiment of FIG. 4 are the same as the corresponding elements of the embodiment of FIG. 1.

Figure 5:
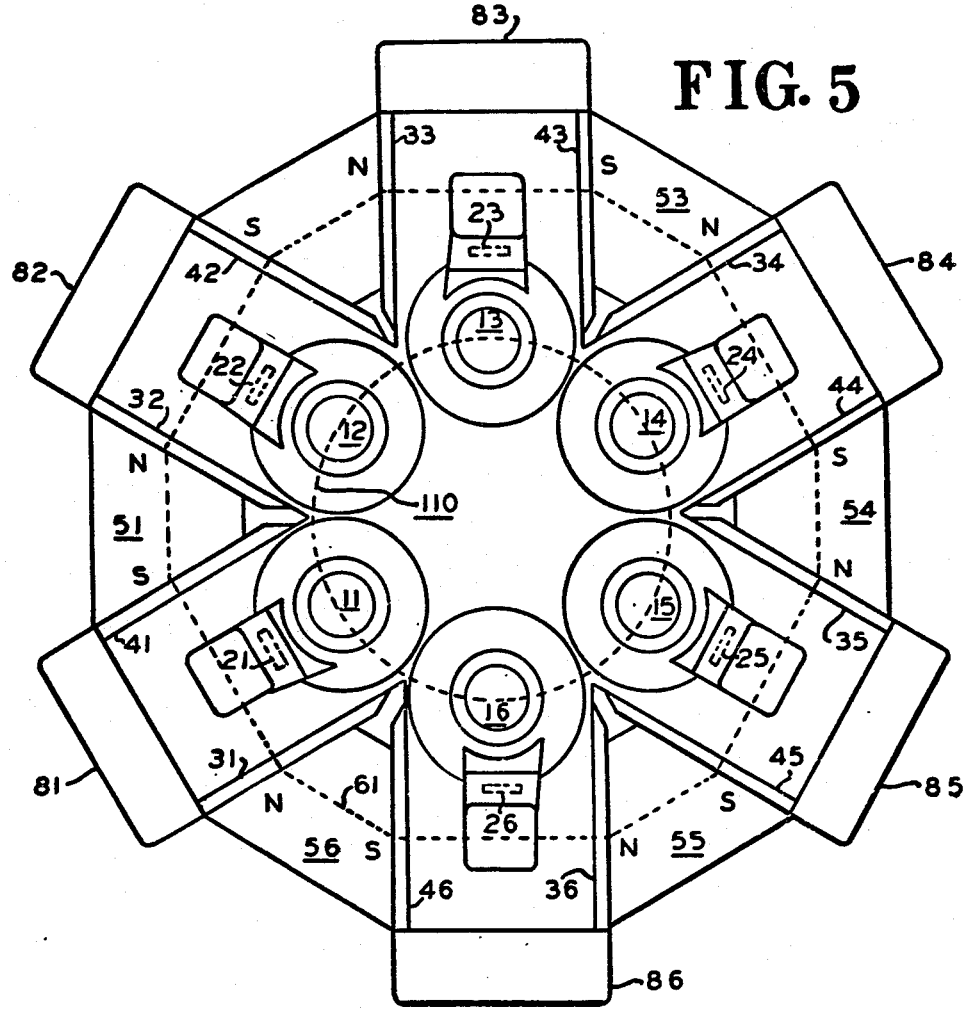
FIG. 5 is a plan view of a vapor source assembly having six electron-beam guns and six crucibles.

FIG. 5 illustrates a third preferred embodiment having a plurality of electron-beam guns 21–26 and a corresponding number of crucibles 11–16. The centers of the circular crucibles are arranged symmetrically along a circle 110. However, the crucibles could be arranged along an irregular figure. Further, the six separate crucibles could be replaced by a single crucible in the location of circle 110 or by an irregularly shaped crucible.

A magnetic deflecting means 60 forms a single magnetic circuit 61 which produces a magnetic field for deflecting the electron beams from the electron beam guns along separate paths to the material to be vaporized. Magnetic deflecting means 60 comprises a plurality of north pole pieces 31–36, a plurality of south pole pieces 41–46, and a plurality of magnets 51–56. Each successive south pole piece is connected to the next successive north pole piece by a magnet, such as magnet 51 which interconnects first south pole piece 41 and second north pole piece 32. Also included are a plurality of beam-sweeping means 81–86 which are associated with electron beam guns 21–26, respectively.

In all of the illustrated embodiments, the angle, such as 62 in FIG. 1, between the south pole piece and the north pole piece which are positioned between two successive electron guns is approximately 60°. The distance between successive guns decreases as this angle decreases. However, angles less than a lower limit of about 30° are less practical because the interconnecting magnet becomes so short. The overall length of a vapor source assembly having two guns tends to increase if angle 62 exceeds 90°.

The drawings and the descriptions herein should be construed as illustrative of various preferred embodiments and not as limiting the scope of the invention which is defined by the claims.

What is claimed is:
1. A vapor source assembly comprising:
 a first crucible for containing a first material to be vaporized;
 a second crucible positioned near the first crucible for containing a second material to be vaporized;
 a first electron-beam gun for producing a first electron beam;
 a second electron-beam gun for producing a second electron beam; and
 a deflecting means for producing a magnetic field to deflect the first electron beam through an arcuate path from the first electron-beam gun to the first crucible, and to deflect the second electron beam through an arcuate path from the second electron-beam gun to the second crucible, said deflecting means including
 a first north pole piece and a first south pole piece positioned on opposite sides of the first electron-beam gun,
 a second north pole piece and a second south pole piece positioned on opposite sides of the second electron-beam gun,
 a first magnetic means comprising a first magnet for interconnecting the first south pole piece and the second north pole piece, and
 a second magnetic means comprising a second magnet for interconnecting the second south pole piece and the first north pole piece.

2. The vapor source assembly according to claim 1 wherein
 the first electron-beam gun is positioned below the maximum level of the material in the first crucible, and
 the second electron-beam gun is positioned below the maximum level of the material in the second crucible.

3. The vapor source assembly according to claim 2 wherein
 the first south pole piece and the second north pole piece extend on opposite sides of the first and second crucibles,
 the first north pole piece does not extend between the first crucible and any adjacent crucible,
 and the second south pole piece does not extend between the second crucible and any adjacent crucible.

4. The vapor source assembly according to claim 3 wherein all parts of the deflecting means are below the top of any crucible.

5. The vapor source assembly according to claim 4 wherein the first electron beam is initially directed horizontally away from the first crucible, and the second electron beam is initially directed horizontally away from the second crucible.

6. The vapor source assembly according to claim 5 wherein the first and second crucibles are adjacent, the first magnet interconnects the first south pole piece and the second north pole piece and the second magnet interconnects the second south pole piece and the first north pole piece.

7. The vapor source assembly according to claim 6 wherein the angle between the first north pole piece and the second south pole piece is between 30° and 90°.

8. The vapor source assembly according to claim 7 further comprising a means for sweeping the electron beams.

9. The vapor source assembly according to claim 3, further comprising:
 a third crucible positioned adjacent the second crucible and between the first and second crucibles for containing a third material to be vaporized;
 a third electron-beam gun positioned below the level of the third crucible for producing a third electron beam;
 a third north pole piece and a third south pole piece which are arranged on opposite sides of the third electron-beam gun to deflect the third electron beam to the third crucible, and which do not extend between the third crucible and any other crucible; and wherein the second magnet interconnects the second south pole piece and the third north pole piece, and the second magnetic means further comprises a third magnetic means comprising a third magnet for interconnecting the third south pole piece and the first north pole piece.

10. The vapor source assembly according to claim 9 wherein the third crucible is adjacent the first crucible, and the third magnet interconnects the third south pole piece and the first north pole piece.

* * * * *